United States Patent
Rearick et al.

(12)

(10) Patent No.: US 7,021,365 B2
(45) Date of Patent: Apr. 4, 2006

(54) COMPONENT TO HEAT SINK SPRING CLIP METHOD AND APPARATUS

(75) Inventors: Donald P. Rearick, Rowlett, TX (US); James R. Walton, Terrell, TX (US)

(73) Assignee: Valere Power, Inc., Richardson, TX (US)

( * ) Notice: Subject to any disclaimer, the term of this patent is extended or adjusted under 35 U.S.C. 154(b) by 71 days.

(21) Appl. No.: 10/219,393

(22) Filed: Aug. 15, 2002

(65) Prior Publication Data

US 2004/0031586 A1    Feb. 19, 2004

(51) Int. Cl.
    *H05K 7/20* (2006.01)
(52) U.S. Cl. ............ 165/80.3; 165/80.2; 361/704; 257/719
(58) Field of Classification Search ............ 165/80.2, 165/80.3, 185; 257/718, 719; 361/704, 361/710; 174/16.3
    See application file for complete search history.

(56) References Cited

U.S. PATENT DOCUMENTS

| 2,870,424 | A | * | 1/1959 | Franz | 439/79 |
| 3,533,589 | A | * | 10/1970 | Schellmann | 248/500 |
| 4,575,038 | A | * | 3/1986 | Moore | 248/505 |
| 4,716,494 | A | * | 12/1987 | Bright et al. | 361/704 |
| 4,766,653 | A | * | 8/1988 | Della Porta | 24/563 |
| 5,170,325 | A | * | 12/1992 | Bentz et al. | 361/707 |
| 5,251,101 | A | * | 10/1993 | Liu | 361/717 |
| 5,995,369 | A | * | 11/1999 | Kiermeier et al. | 361/704 |
| 6,249,436 | B1 | * | 6/2001 | Bollesen | 361/720 |
| 6,587,344 | B1 | * | 7/2003 | Ross | 361/704 |
| 6,617,685 | B1 | * | 9/2003 | Bollesen | 257/719 |

* cited by examiner

*Primary Examiner*—Allen J. Flanigan
(74) *Attorney, Agent, or Firm*—Carr LLP

(57) ABSTRACT

Disclosed is a spring clip apparatus for holding one or more heat generating components, such as field effect transistors (FETs) and diodes, firmly against a heat receiving side of a finned heat radiating device having slots within or between the fins. In a finned heat sink, a moving arm of the clip slides into and makes contact with the heat sink in the slot and the confines of the slot prevent further sideways movement while another arm contact point of the clip holds the component firmly in position against the heat sink opposite the moving arm contact point. Clips may be both single and dual arm and may be configured for holding from one to multiple components in contact with the heat sink. The clip may also be used in a similar manner with a non-finned heat sink.

11 Claims, 5 Drawing Sheets

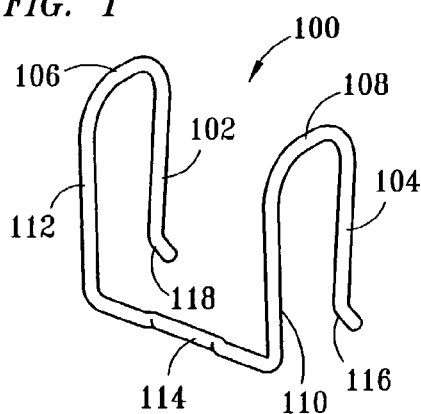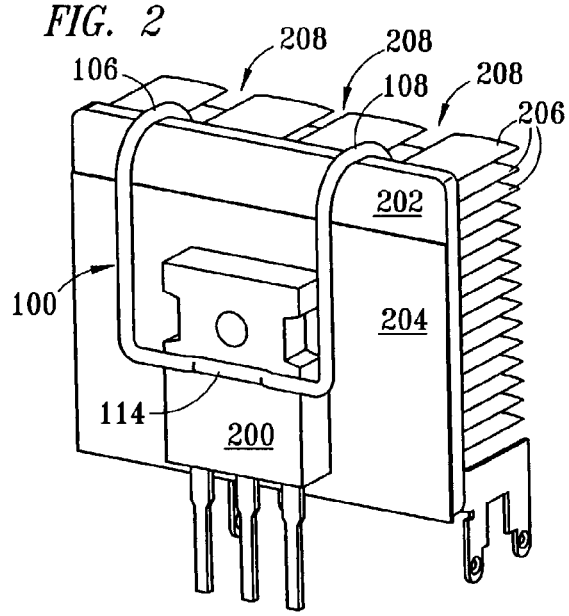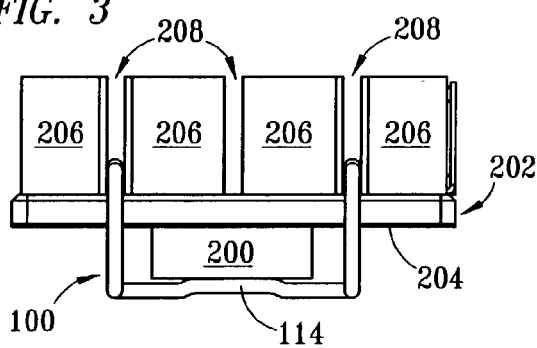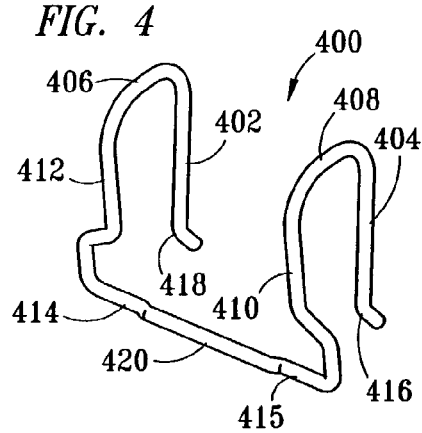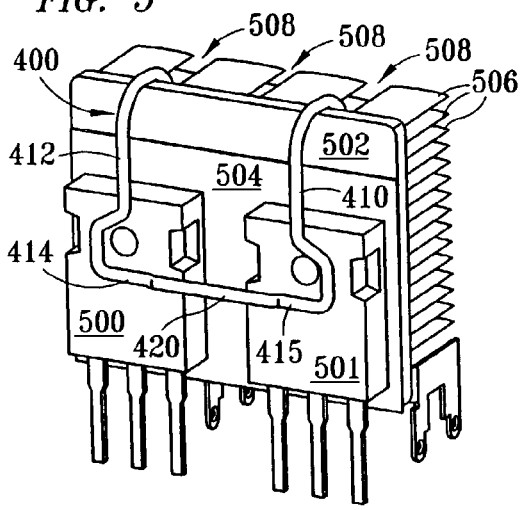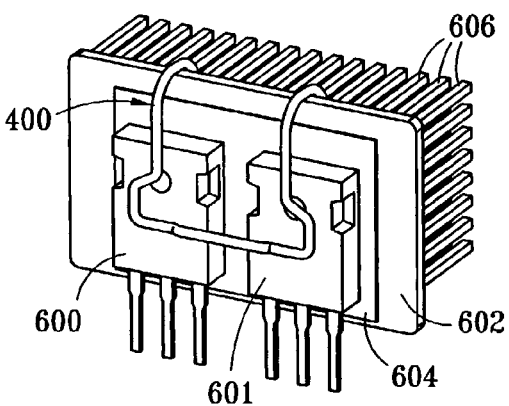

US 7,021,365 B2

COMPONENT TO HEAT SINK SPRING CLIP METHOD AND APPARATUS

TECHNICAL FIELD

The present invention relates in general to a spring clip for quickly and securely attaching or mounting one or more electrical or other heat generating components to a heat sink or other heat dissipating device.

BACKGROUND

To remain competitive as technology advances, electronic designers must reduce required system physical space while increasing the system performance. This generally translates into increased power dissipation in a smaller space. However, as is well known, component reliability/life is related to operating temperature. Thus, the challenge is to pack the heat generating components closer together while maintaining acceptably cool temperatures. Traditionally, heat sinks are used to transfer heat from these components to the surrounding environment.

There are many prior art methods of attaching heat generating components, such as field effect transistors (FETs) and diodes, to heat dissipating devices. These include screws, straps, adhesives and spring clips of various types. Among the disadvantages of using screws is the time for attachment, along with the problem of electrical insulation of the component from the screw and heat sink. Straps often require some mode of securing them to the heat sink that causes an undesirable increase in space required for the combination of parts. Adhesives have disadvantages with storage and handling and some can fail with time. Further, a good adhesive may well prevent the reuse of the heat sink in the case where a failed component needs replacement. Known prior art spring clips interfere with air flow on the surface of the component(s) being cooled, some being of a design which increase the length of the path from the component to the fins of the heat sink and/or unduly increase the space required for the heat sink/component package relative nearby components.

As known among thermodynamic experts, having slots periodically situated in the fins of a heat sink disrupts air flow patterns and results in better heat dissipation than unslotted fins. While the slots are important to disrupt air flow patterns, the wider the slot, the less material is left to conduct and/or radiate heat to the environment. Thus most manufacturers of finned heat sinks have slots of a width just enough to provide adequate air flow disruption. For electronic circuits, these slots are typically about 1/10 inch or less in width. There are, however, many other types of finned and non-finned heat dissipating devices to which heat generating devices need to be attached.

It would be desirable if an attachment device could allow quick assembly of one or more components to a heat sink in a secure manner that did not substantially increase package profile dimensions, thereby allowing a higher density packaging, and still allowing replacement of components in a repair mode. It would further be desirable if such attachment device could, without major design modification, be adapted to be used on many different styles of heat dissipating devices.

SUMMARY OF THE INVENTION

The foregoing disadvantages are overcome by the present spring clip invention, which in a preferred embodiment comprises wire-like spring material of a diameter or width that does not exceed the width of slots in the fins of a heat sink and which further increases the thickness of the combined heat sink/attached component by only the thickness or diameter of the spring clip material.

BRIEF DESCRIPTION OF THE DRAWINGS

For a more complete understanding of the present invention, and its advantages, reference will now be made in the following Detailed Description to the accompanying drawings, in which:

FIG. 1 is an isometric view of a spring clip for attaching a single component to a heat sink;

FIG. 2 is an isometric view of the spring clip of FIG. 1 holding a component to a heat sink using blade type fins;

FIG. 3 is a top view of the apparatus of FIG. 2;

FIG. 4 is an isometric view of a version of the spring clip for holding a pair of components to a heat sink;

FIG. 5 is an isometric view of the spring clip of FIG. 4 holding a pair of components to a heat sink;

FIG. 6 is an isometric view of the spring clip of FIG. 4 holding a pair of components to a heat sink using pin fins;

DETAILED DESCRIPTION

Figure 7:
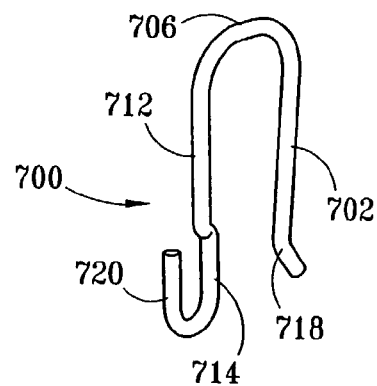
FIG. 7 is an isometric view of another version of a spring clip for attaching a single component to a heat sink.

In FIG. 1, a spring clip for attaching a single component to a heat sink is generally designated as 100. The clip 100 may be constructed from a single piece of material, such as a spring steel piece of wire. The clip 100 includes two generally curved spring length arms or slot pressure arms 102 and 104 that fit into fin slots of a heat sink. These arms 102 and 104 comprise the main moving or flexing portions of the clip although any portion of the clip may be temporarily deformed during the assembly process as long as the material is not deformed past its elasticity point. The arm 102 extends to a bit portion 106, which bit portion conforms to an area at an edge of the heat sink. In a similar manner, the arm 104 extends to a bit portion 108. A component holding or clamping arm 112 extends at an angle to the bit portion 106 in a direction to hold a component stationary against the non-finned side of a heat sink. A further component holding or clamping arm 110 extends at an angle to the bit portion 108 in a direction to hold the component stationary against the non-finned side of a heat sink. A further portion of the clip 100, designated as 114, completes an extension of the arms 110 and 112 and acts as the clip contact point for applying a substantial pressure against a component to maintain good heat transmitting contact between the component and the heat sink. As will be realized, a thermally conductive but electrically isolating insulator may need to be used between the component and the heat sink with some component packaging designs. As may be further noted, a bent portion of arm 104 is labeled 116 and a similar bent portion of arm 102 is labeled 118. The portions 116 and 118 provide the contact points of the clip on the fin side of the heat sink. In a typical design of the clip, the vertical distance from bit portions 106 and 108 on the edge of the heat sink to contact points 118 and 116, respectively, will be substantially the same as the vertical distance from these same bit portions 106 and 108 to the contact point 114. In other words, the pressure applied to the component is substantially the same distance from the edge of the heat sink as the pressure applied directly to the heat sink on the fin side of the heat sink. It will be realized that this typical design is not required to practice the invention.

The portions 110 and 112 may be configured to enclose the component on each side to prevent sidewise movement of the component. The undesignated curved portions between contact point 114 and the portions 110 and 112 may be raised from the surface of the component being held. The raising of these portions allows the use of a fingernail or other tool to easily raise this portion of the clip 100 to facilitate the installation, removal or repositioning of a component contiguous a heat receiving portion of a heat sink.

In FIGS. 2 and 3, it may be seen that a component 200 is held in place by the spring clip 100 of FIG. 1 to transfer heat to a heat sink 202. A piece of electrical insulating material 204 prevents electrical contact between the component 200 and the heat sink 202. As shown, the heat sink 202 has a plurality of fins 206, only a few of which are specifically designated. Three slots 208 are illustrated in the fins 206 and the portions 102 and 104 of the clip 100 are inserted into two of the slots 208.

In FIG. 4, a spring clip for attaching a pair of components to a heat sink is generally designated as 400. The clip 400 is constructed in a manner similar to that of clip 100 and has the various portions labeled in a manner similar to that of clip 100 except that they are 400 series designators and that there are two clip contact points 414 and 415 for applying a substantial pressure against a pair of components to maintain good heat transmitting contact between the components and the heat sink. A raised portion 420 between contact points 414 and 415 allows the use of a fingernail or other tool to easily raise this portion of the clip 400 to facilitate the installation, removal or repositioning of a component contiguous a heat receiving portion of a heat sink.

In FIG. 5, an assembly having two components 500 and 501 are shown held in place against a heat sink 502 by the clip 400 of FIG. 4. Again, a piece of insulating material 504 prevents electrical contact between the components, 500 and 501, and the heat sink 502. It may be noted that pressure arms 402 and 404 will act independently and thereby accommodate the possibility of component 500 being of thickness different from that of component 501.

In FIG. 6, a pair of components 600 and 601 are held in place against a heat sink 602 by the clip 400 of FIG. 4. This heat sink uses a large plurality of pin type heat dissipating fins 606 as opposed to the slotted blade type fins of the previous figures. Again, the diameter or width of the spring clip needs to fit in the slots between the pins 606. It may be noted that heat sinks of this type may have either rectangular or round pin type fins.

In FIG. 7, a spring clip for attaching a component to a heat sink is generally designated as 700. The clip 700 is constructed in a manner similar to that of clip 100 except that it has a single slot contact point 718. Otherwise, it has the various portions labeled in a manner similar to that of clip 100 except that they are 700 series designators. To maintain equivalent heat transmitting contact pressure between the component and the heat sink, the spring force of such a spring needs to be about twice that required of clip 100, which has two arms to provide force. As an aside, since clip 400 is holding two components in place, the spring force of this clip also needs to be increased over that of clip 100 in order to obtain the same heat transfer from the two components as provided by the single component clip 100. A raised portion 712 allows the use of a fingernail or other tool to easily raise this portion of the clip 700 to facilitate the installation, removal or repositioning of a component contiguous a heat receiving portion of a heat sink. An optional projection 720 may alternatively be used for this feature when there is adequate room.

Figure 8:
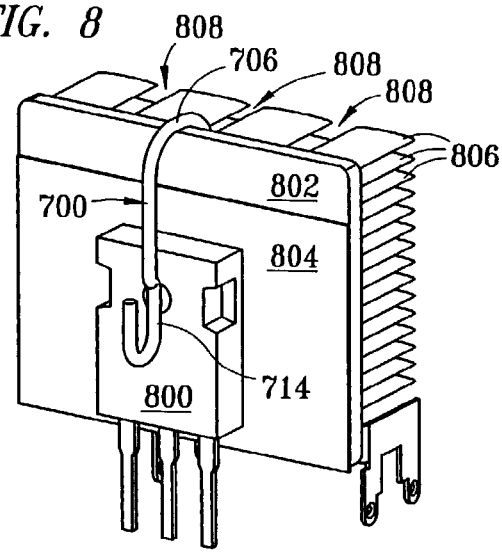
FIG. 8 is an isometric view of the spring clip of FIG. 7 holding a component to a heat sink.

In FIG. 8, an assembly having a component 800 is shown held in place against a heat sink 802 by the clip 700 of FIG. 7. Again, a piece of insulating material 804 prevents electrical contact between the component 800 and the heat sink 802.

Figure 9:
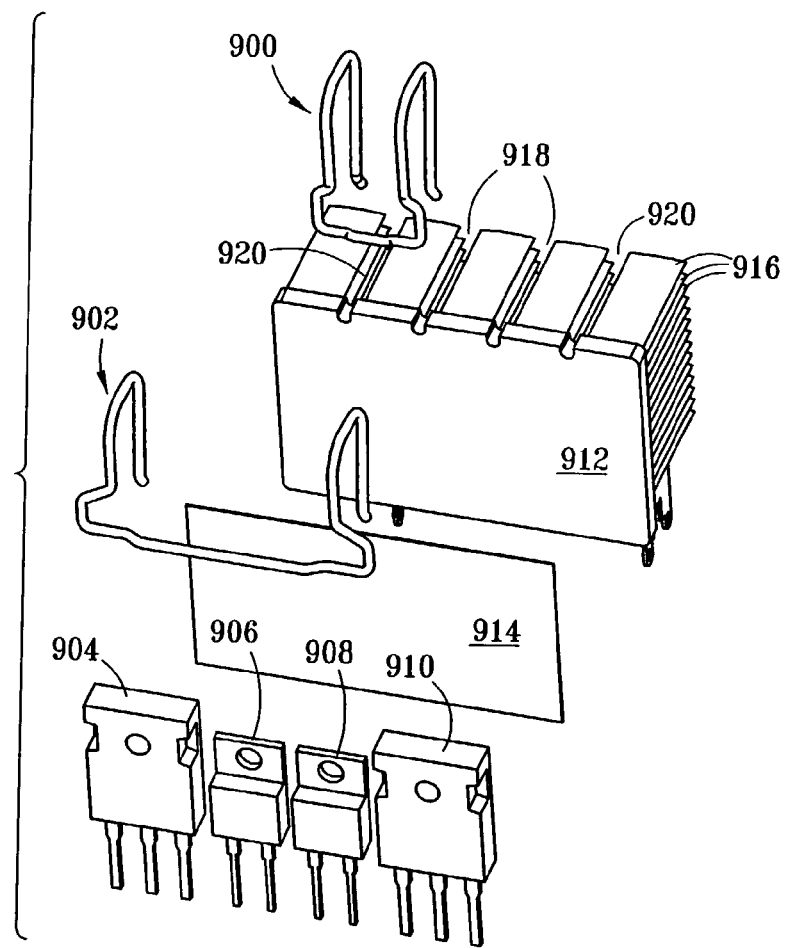
FIG. 9 is an exploded isometric view of the parts used to attach four components to a single heat sink using a pair of spring clips of slightly different configuration.
Figure 10:
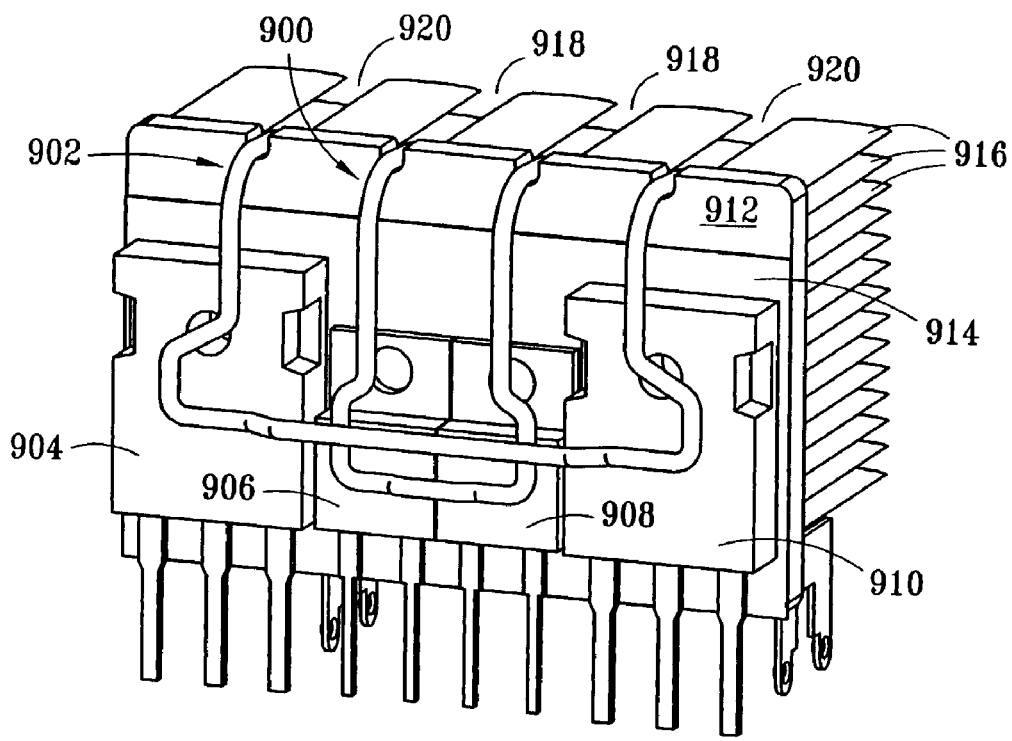
FIG. 10 is an isometric assembled view of FIG. 9.

In FIG. 9, a pair of dual component spring clips 900 and 902 are shown for attaching components 904, 906, 908 and 910 to a heat sink 912. Increased component density can be obtained using this variation of the clip design. The clip 900 holds components 906 and 908 in place against an intervening electrical insulating material 914 in a manner shown in previous figures. The arms of clip 900 are inserted in slots 918 of fins 916. Subsequently, the clip 902 is clipped over the components 904 and 910 using slots designated as 920. As shown, the two clips are of different widths and lengths. The same designators are used in the assembled view of FIG. 10.

It may be noted that slots have been cut in the top of the heat sink 912 to minimize the height of the assembled product. However, unless the height of the assembly is critical, such slots are typically not necessary and are not shown in the other illustrated heat sinks.

Figure 11:
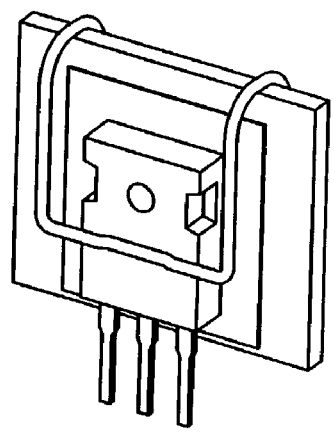
FIGS. 11 through 20 are isometric front and back views illustrating the use of the spring clip attaching a heat generating device to various other designs of heat dissipating devices.
Figure 12:
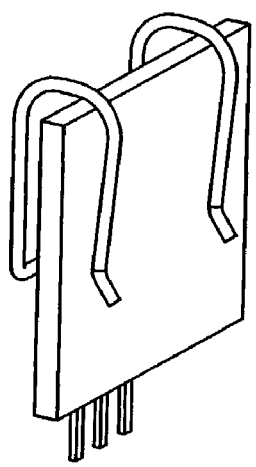
Figure 13:
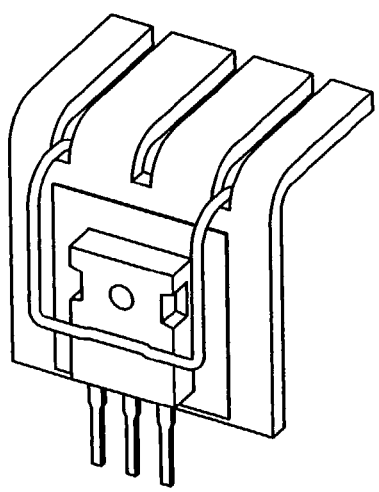
Figure 14:
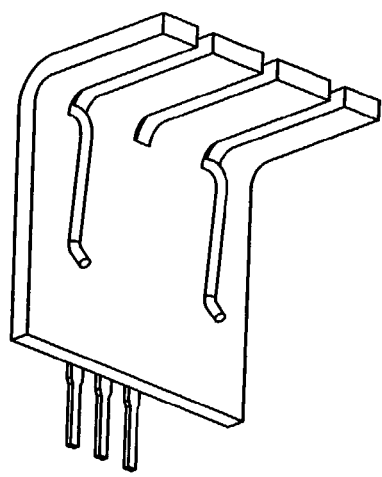
Figure 15:
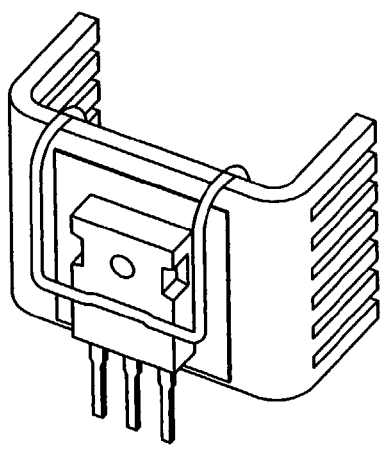
Figure 16:
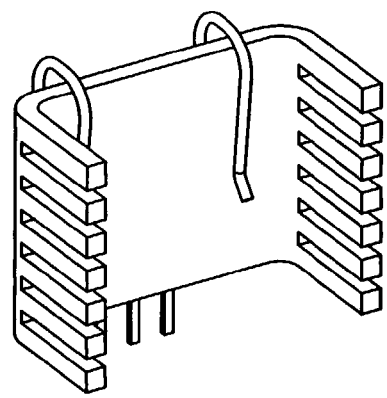
Figure 17:
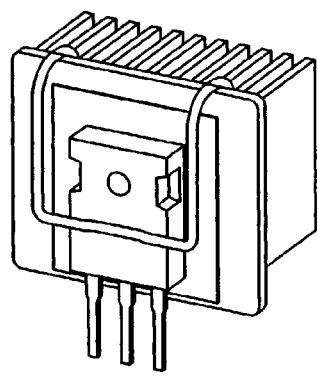
Figure 18:
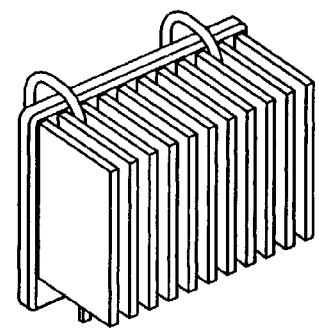
Figure 19:
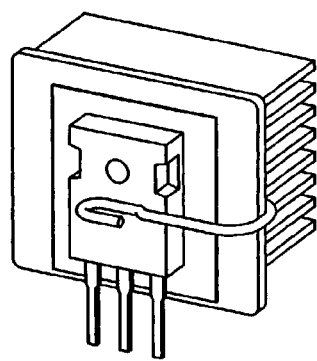
Figure 20:
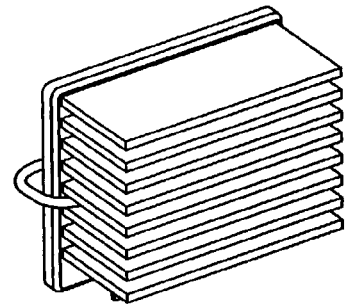

In FIGS. 11 and 12, the spring clip of FIG. 1 is shown used with a non-finned heat dissipating device.

In FIGS. 13, 14, 15 and 16, the spring clip of FIG. 1 is shown used with other types of finned heat dissipating devices.

In FIGS. 17, 18, 19 and 20, the fins are not slotted and the clips of FIGS. 1 and 7 are shown inserted between fin rows.

While the heat dissipating devices shown in FIGS. 11-20 are not as efficient at dissipating heat from heat generating devices as the fin slotted heat sinks of FIG. 2, such less efficient heat sinks may advantageously be used for cost, space and other reasons. As may be observed, the present spring clip design need not be changed to accommodate attachment of heat generating devices to any of many different heat sink styles and designs.

In summary, disclosed is a clip design that does not disruptively interfere with heat dissipating air flow in the vicinity of the heat sink or component and does not increase the heat transfer path from the heat generating component to the heat sink fins. Further, the present clip requires no modification of present heat sink designs and adds minimal weight to an assembly. Even further, components may be quickly assembled or detached and replaced when necessary. Additionally, the present clip does not substantially increase the package profile.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It is therefore contemplated that the claims will cover any such modifications or embodiments that fall within the true scope and spirit of the invention.

What is claimed is:

1. A method of affixing a component to a heat sink having opposing heat receiving and finned heat transmitting surfaces and including slots running transverse to the length of the fins, comprising the steps of:
    placing a component next to the heat receiving surface of a heat sink; and
    installing a two arm spring clip having two U-shaped arms connected by a central U-shaped portion over the combination of the component and the heat sink
    wherein the two U-shaped arms are not co-planar with the central U-shaped portion; and
    wherein the two U-shaped arms of the spring clip are inserted in slots of the fins and a contact point on the central U-shaped portion provides pressure against the side of the component not in contact with the heat sink.

2. A heat sink spring clip, comprising:
    at least two fin slot contact pressure points by two U-shaped arms adapted to fit within heat sink fin slots of a heat sink, wherein the heat sink fin slots traverse a portion of a length of a base from which the heat sink fins extend;
    at least one component pressure contact by a central U-shaped portion adapted to apply pressure to a component, wherein the central U-shaped portion is not co-planar with the two U-shaped arms; and
    a spring pressure by two U-shaped arms intermediate said fin slot contact pressure points and said component pressure contact, intermediate the at least two fin slot contact pressure points, whereby in use a component is held contiguous a heat receiving portion of a heat sink.

3. The heat sink spring clip as claimed in claim 2 wherein a portion of the clip adjacent the component may be raised to facilitate raising the component contact portion in the process of installing and/or removing the component from contact with a heat sink.

4. An article of manufacture, comprising:
    a heat sink having opposing heat receiving and finned heat transmitting surfaces and including slots in the finned heat transmitting surfaces;
    a heat generating component contiguous the heat receiving surface of the heat sink;
    a spring clip, having at least two U-shaped slot pressure arms, encompassing the combination of the component and the heat sink where the slot pressure arms of the spring clip are each inserted in a slot of the fins;
    wherein the spring clip comprises a component pressure point by a U-shaped portion of the spring clip, intermediate the at least two arms, provides pressure against the side of the component not in heat transfer contact with the heat sink; and
    wherein the two U-shaped arms are not co-planar with the U-shaped portion.

5. A method of affixing a component to a heat sink having opposing heat receiving and heat transmitting surfaces and including slots in the heat transmitting surfaces, comprising the steps of:
    placing a component next to the heat receiving surface of a heat sink;
    installing at least two spring clip arms over the combination of the component and the heat sink where the at least two spring clip arms of a spring clip are each inserted in a slot of the heat transmitting surface, which traverses a portion of a length of a base from which heat sink fins extend; and
    a component contact point arm of the spring clip, comprising a component contact point intermediate the two arms, provides pressure against the side of the component not in contact with the heat sink, wherein the two spring clip arms are not co-planar with the contact point arm.

6. A method of affixing a component to a heat sink having opposing heat receiving and heat transmitting surfaces, comprising the steps of:
    positioning a component next to the heat receiving surface of a heat sink; and
    installing at least two spring clip arms over the combination of the component and the heat sink where the at least two spring clip arms of a spring clip contacts the heat transmitting surface of the heat sink and a component contact point arm of the spring clip;
    connecting the spring clip so that the two spring clip arms and the contact point arm are not co-planar; and
    providing pressure against the side of the component not in contact with the heat sink that at least has a component contact point that is intermediate the at least two arms.

7. A heat sink spring clip, comprising:
    at least two contact pressure points by two U-shaped clip arms adapted to apply pressure to a heat transmitting side of a heat sink at fin slot contact points;
    at least one component pressure contact portion adapted to apply pressure to a component, wherein the component pressure contact portion is not co-planar with the two clip arms; and
    a spring pressure applying portion intermediate said fin slot contact pressure points and said component pressure contact portion whereby in use a component is held contiguous a heat receiving portion of a heat sink.

8. The component as claimed in claim 7 wherein a portion of the clip adjacent the component may be raised to facilitate raising the component contact portion in the process of installing and/or removing the component from contact with a heat sink.

9. An article of manufacture, comprising:
    a heat sink having opposing heat receiving and heat transmitting surfaces;

a heat generating component contiguous the heat receiving surface of the heat sink; and a spring clip, having at least two heat sink pressure arms, encompassing the combination of the component and the heat sink where the heat sink pressure arms of the spring clip provides pressure against the heat transmitting surface of the heat sink;

wherein a central portion of the spring clip comprises a component pressure point of the spring clip provides pressure, intermediate the at least two heat sink pressure points, against the side of the component not in heat transfer contact with the heat sink; and wherein the central portion of the spring clip is not co-planar with the two heat sink pressure arms.

10. An apparatus for maintaining mechanical contact between heat sink and an electrical component comprising:

at least one first U-shaped arm, wherein the at least one first arm is at least configured to be in mechanical contact with the electrical component; and at least two U-shaped second arms, wherein the at least two second arms are at least configured to be in contact with the heat sink, and wherein the at least two second arms are at least configured to be coupled to the at least one first arm;

wherein the first arm and the two second arms are not co-planar.

11. A heat sink clip for clipping a component to a heat sink, comprising:

at least two U-shaped arms that fit within heat sink fin slots, traversing a portion of a length of a base from which the heat sink fins extend; and a U-shaped component contact arm that provides pressure to the component at a point intermediate the at least two arms that is interconnected to each of the at least two arms by at least one spring, wherein the U-shaped component contact arm is not co-planar with the at least two arms U-shaped arms.

* * * * *